(12) United States Patent
Lin et al.

(10) Patent No.: US 10,283,700 B2
(45) Date of Patent: May 7, 2019

(54) SEMICONDUCTOR MEMORY STRUCTURE WITH MAGNETIC TUNNEL JUNCTION (MTJ) CELL

(71) Applicant: Taiwan Semiconductor Manufacturing Co., Ltd., Hsinchu (TW)

(72) Inventors: Shih-Wei Lin, Taipei (TW); Yuan-Tai Tseng, Zhubei (TW); Shih-Chang Liu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

(21) Appl. No.: 15/627,651

(22) Filed: Jun. 20, 2017

(65) Prior Publication Data

US 2018/0366638 A1 Dec. 20, 2018

(51) Int. Cl.
*H01L 27/22* (2006.01)
*H01L 43/08* (2006.01)
*H01L 43/02* (2006.01)
*H01L 43/12* (2006.01)

(52) U.S. Cl.
CPC ............ *H01L 43/08* (2013.01); *H01L 27/228* (2013.01); *H01L 43/02* (2013.01); *H01L 43/12* (2013.01)

(58) Field of Classification Search
CPC .................................................. H01L 27/228
See application file for complete search history.

(56) References Cited

U.S. PATENT DOCUMENTS

| 6,028,362 | A | 2/2000 | Omura |
| 7,723,128 | B2 | 5/2010 | Wang et al. |
| 7,760,473 | B2 | 7/2010 | Ide et al. |
| 9,142,762 | B1 | 9/2015 | Li et al. |
| 9,231,193 | B2* | 1/2016 | Iwayama ................ H01L 43/12 |
| 9,306,152 | B2* | 4/2016 | Iwayama ................ H01L 43/08 |
| 9,343,659 | B1 | 5/2016 | Lu et al. |
| 9,450,183 | B2 | 9/2016 | Huang et al. |
| 9,502,466 | B1 | 11/2016 | Chuang et al. |
| 2004/0205958 | A1* | 10/2004 | Grynkewich ........... G11C 11/16 29/603.14 |
| 2006/0227467 | A1 | 10/2006 | Ide et al. |
| 2009/0261433 | A1* | 10/2009 | Kang ..................... H01L 43/08 257/421 |
| 2009/0302362 | A1 | 12/2009 | Kikuchi et al. |
| 2010/0102404 | A1* | 4/2010 | Li ........................... H01L 43/08 257/421 |

(Continued)

OTHER PUBLICATIONS

Non-Final Office Action dated Feb. 2, 2018, issued in U.S. Appl. No. 15/627,646.

(Continued)

*Primary Examiner* — Eugene Lee
(74) *Attorney, Agent, or Firm* — McClure, Qualey & Rodack, LLP

(57) ABSTRACT

A semiconductor memory structure is provided. The semiconductor memory structure includes a bottom electrode formed over a substrate and a magnetic tunneling junction (MTJ) cell formed over the bottom electrode. The semiconductor memory structure also includes a top electrode formed over the MTJ cell; and a first sidewall spacer layer formed on a top surface of the MTJ cell and an outer sidewall surface of the top electrode.

20 Claims, 15 Drawing Sheets

(56) References Cited

U.S. PATENT DOCUMENTS

| | | |
|---|---|---|
| 2011/0037108 A1 | 2/2011 | Sugiura et al. |
| 2011/0229985 A1 | 9/2011 | Li |
| 2011/0272380 A1 | 11/2011 | Jeong et al. |
| 2012/0086089 A1* | 4/2012 | Li .................... H01L 43/12 |
| | | 257/421 |
| 2012/0252184 A1 | 10/2012 | Ninomiya et al. |
| 2013/0119494 A1* | 5/2013 | Li .................... H01L 43/08 |
| | | 257/421 |
| 2013/0155761 A1* | 6/2013 | Aoki ................ G11C 11/161 |
| | | 365/158 |
| 2014/0042567 A1* | 2/2014 | Jung ................ H01L 43/08 |
| | | 257/421 |
| 2014/0198564 A1* | 7/2014 | Guo ................ G11C 11/161 |
| | | 365/158 |
| 2015/0061052 A1* | 3/2015 | Huang .............. H01L 43/08 |
| | | 257/421 |
| 2015/0255507 A1* | 9/2015 | Pakala .............. H01L 43/12 |
| | | 257/421 |
| 2016/0072045 A1* | 3/2016 | Kanaya ............ H01L 43/08 |
| | | 257/427 |
| 2016/0268499 A1 | 9/2016 | You et al. |
| 2016/0351792 A1 | 12/2016 | Jiang et al. |
| 2016/0380183 A1 | 12/2016 | Chuang et al. |

OTHER PUBLICATIONS

Final Office Action dated Aug. 8, 2018, issued in U.S. Appl. No. 15/627,646.

* cited by examiner

SEMICONDUCTOR MEMORY STRUCTURE WITH MAGNETIC TUNNEL JUNCTION (MTJ) CELL

CROSS REFERENCE TO RELATED APPLICATIONS

This application is related to the following co-pending of a commonly assigned patent application: U.S. application Ser. No. 15/627,646, filed on Jun. 20, 2017, and entitled "Semiconductor Memory Structure with Magnetic Tunnel Junction (MTJ) Cell", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Magnetic Random Access Memory (MRAM), based on the integration of silicon CMOS with Magnetic Tunneling Junction (MTJ) technology, is a major emerging technology that is highly competitive with existing semiconductor memories such as Static Random Access Memory (SRAM), Dynamic Random Access Memory (DRAM), and Flash.

Although existing semiconductor memory structures and methods for forming the same have been generally adequate for their intended purposes they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
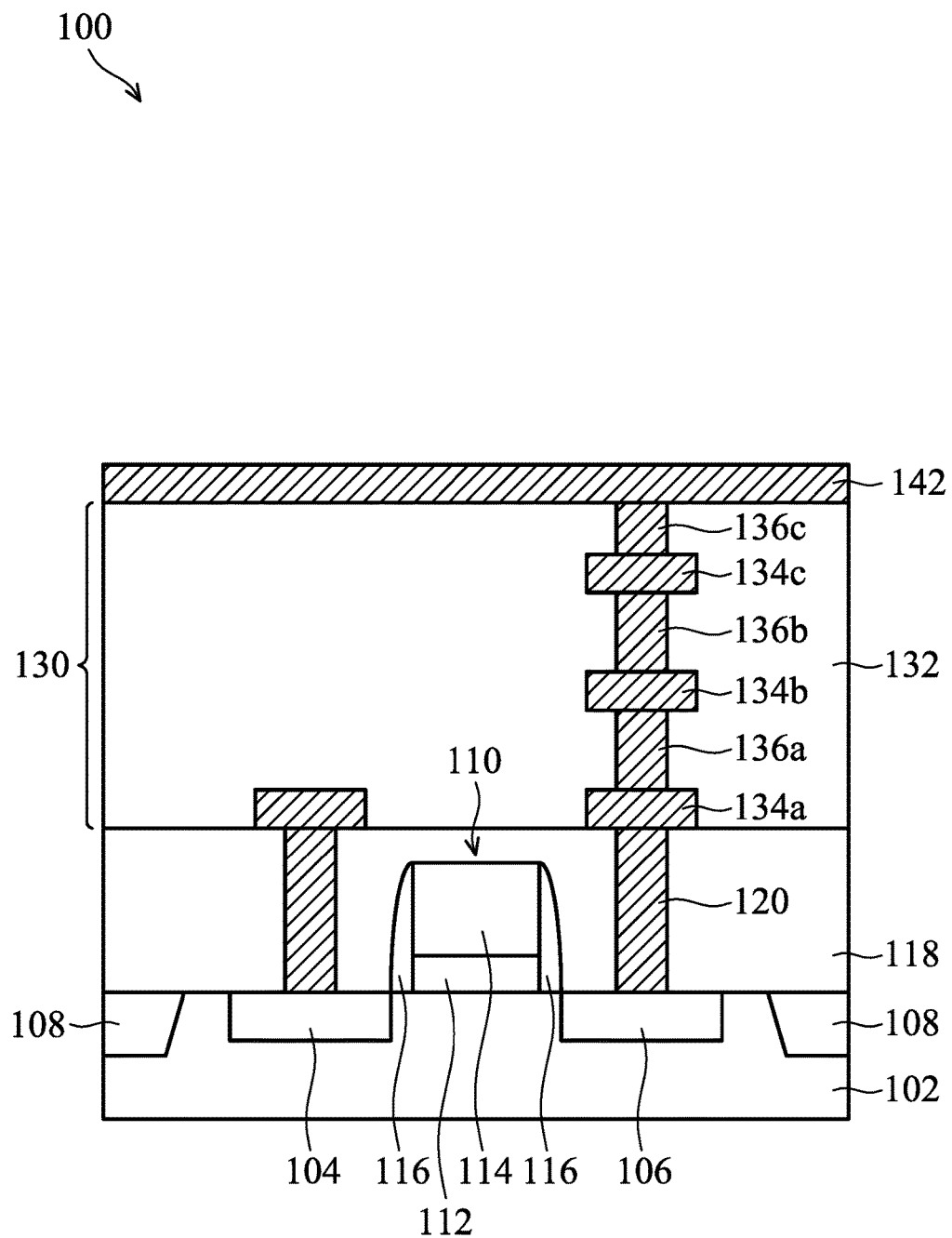
FIGS. 1A-1I show cross-sectional representations of various stages of forming a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor memory structure and method for forming the same are provided. FIGS. 1A-1I show cross-sectional representations of various stages of forming a semiconductor memory structure 100, in accordance with some embodiments of the disclosure. In some embodiments, the semiconductor memory structure 100 is a magnetic random access memory (MRAM). The semiconductor memory structure 100 includes a magnetic tunnel junction (MTJ) cell between a bottom electrode and a top electrode, and a first sidewall spacer layer is formed on a top surface of the MTJ cell and an outer sidewall surface of the top electrode.

Referring to FIG. 1A, a substrate 102 is provided. The substrate 102 may be made of silicon or another semiconductor material. In some embodiments, the substrate 102 is a wafer. Alternatively or additionally, the substrate 102 may include other elementary semiconductor materials such as germanium. In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

A transistor device 110 is formed over the substrate 102. A source region 104 and a drain region 106 are formed in the substrate 102. The source region 104 and the drain region 106 are formed at opposite sides of the transistor device 110. In some embodiments, the source region 104 and the drain region 106 are doped regions. The doped regions may be doped with n-type and/or p-type dopants. In some embodiments, the doped regions are formed by an ion implantation process, a diffusion process, or another applicable process.

An isolation structure 108, such as shallow trench isolation (STI) structures or local oxidation of silicon (LOCOS) structures, is formed in the substrate 102. The isolation structure 108 may define and isolate various integrated circuit devices.

The transistor device 110 includes a gate dielectric layer 112 and a gate electrode layer 114 over the gate dielectric layer 112. The gate dielectric layer 112 is made of silicon oxide, silicon nitride, or a high dielectric constant material (high-k material). In some embodiments, the gate dielectric layer 112 is formed by a chemical vapor deposition (CVD) process.

The gate electrode layer 114 may be made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, the gate electrode layer 114 is formed by a deposition process, such as a chemical vapor deposition (CVD) process or a physical vapor deposition (PVD) process.

The gate spacers 116 are formed on sidewalls of the transistor device 110. In some embodiments, the gate spacers 116 are made of silicon oxide, silicon nitride, silicon oxynitride or another applicable material. In some embodiments, the gate spacers 116 are formed by a chemical vapor deposition (CVD) process or a physical vapor deposition (PVD) process.

An inter-layer dielectric (ILD) layer 118 is formed on the substrate 102 and over the transistor device 110, and a contact structure 120 is formed on the source region 104 and the drain region 106. The ILD layer 118 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or another applicable dielectric material. The ILD layer 118 may be formed by a deposition process, such as chemical vapor deposition (CVD) process, physical vapor deposition (PVD) process, atomic layer deposition (ALD) process, spin-on coating process, or another applicable process.

An interconnect structure 130 is formed over the substrate 102 and the ILD layer 118. The interconnect structure 130 is used to electrically connect the signal of the transistor device 110 to the external environment.

The interconnect structure 130 includes multiple conductive features formed in a first dielectric layer 132 (such as inter-metal dielectric, IMD). The first dielectric layer 132 includes multiple dielectric layers. The first dielectric layer 132 may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the first dielectric layer 132 is formed by a deposition process, such as a chemical vapor deposition (CVD) process, a spin-on process, a sputtering process, or a combination thereof.

In some embodiments, the first dielectric layer 132 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a number of conductive lines 134a, 134b and 134c and a number of conductive vias 136a, 136b and 136c. Each of the conductive lines 134a, 134b and 134c is electrically connected to one of the conductive vias 136a, 136b and 136c. The conductive lines 134a, 134b and 134c are electrically connected to the drain region 106 through the contact structure 120. In some embodiments, the first conductive line 134a is called a first metal layer ($M_1$), the second conductive line 134b is called a second metal layer ($M_2$), the third conductive line 134c is called a third metal layer ($M_3$).

In some embodiments, the conductive features are made of metal materials, such as copper (Cu), aluminum (Al), titanium (Ti), tantalum (Ta), nickel (Ni), silver (Ag), gold (Au), indium (In), tin (Sn), or a combination thereof. In some embodiments, the conductive features are formed by electro-plating, electroless plating, sputtering, chemical vapor deposition (CVD), or another applicable process.

The conductive lines 134a, 134b and 134c and the conductive vias 136a, 136b and 136c as illustrated are exemplary, and the actual positioning and configuration of the conductive lines 134a, 134b and 134c and the conductive vias 136a, 136b and 136c may vary according to actual application.

Afterwards, as shown in FIG. 1A, a bottom electrode 142 is formed over the first dielectric layer 132 of the interconnect structure 130. The bottom electrode 142 is electrically connected to the drain region 106 through the conductive features of the interconnect structure 130. The bottom electrode 142 is made of conductive material, such as tantalum (Ta), titanium (Ti), platinum (Pt), copper (Cu), tungsten (W), aluminum (Al), titanium nitride (TiN), tantalum nitride (TaN), and tungsten silicide (WSi), tantalum nitride (TaN), or another applicable material. In some embodiments, the bottom electrode 142 is formed by electro-plating process, electroless plating process, sputtering process, chemical vapor deposition (CVD) process, or another applicable process.

Figure 1B:
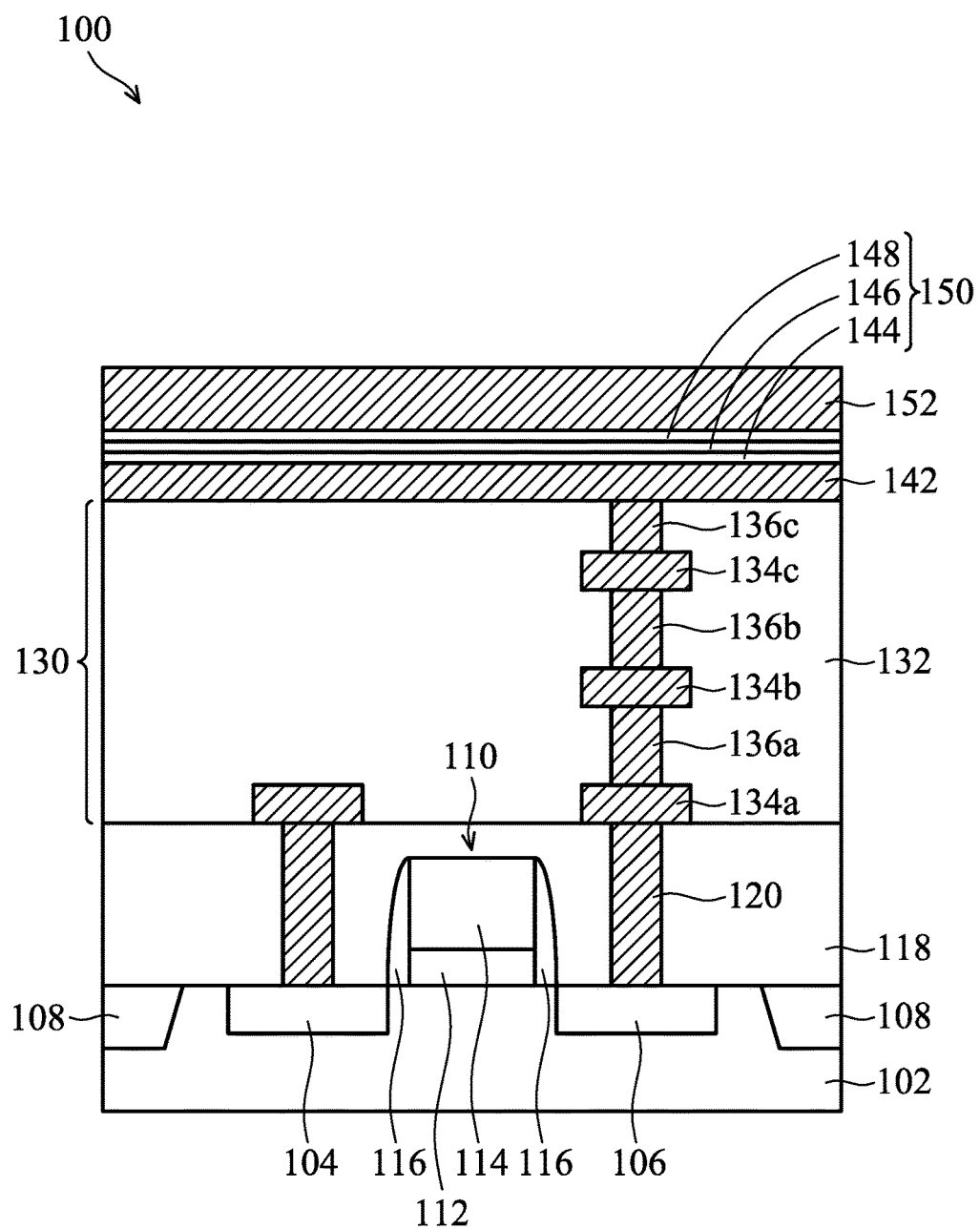

Afterwards, as shown in FIG. 1B, a MTJ cell 150 is formed over the bottom electrode 142, in accordance with some embodiments of the disclosure. The MTJ cell 150 is the core of the memory device 160. The MTJ cell 150 includes at least three layers.

The MTJ cell 150 includes a first ferromagnetic layer 144, an insulator layer 146 and a second ferromagnetic layer 148. The first ferromagnetic layer 144 is formed on the bottom electrode 142, the insulator layer 146 is formed on the first ferromagnetic layer 144 and the second ferromagnetic layer 148 is formed on the insulator layer 146. The bottom electrode 142 is electrically connected to the first ferromagnetic layer 144 (or called pin layer), and the top electrode 152 is electrically connected to the second ferromagnetic layer 148 (or called free layer).

In some embodiments, the first ferromagnetic layer 144 and the second ferromagnetic layer 148 are independently made of the materials with ferromagnetism, such as Cobalt-Iron-Boron (CoFeB), CoFe, and Nickel-Iron (NiFe), Co, Fe, Ni, FeB, or FePt. The first ferromagnetic layer 144 and the second ferromagnetic layer 148 are made of different materials. In some embodiments, the first ferromagnetic layer 144 is made of $Co_xFe_yB_z$ (x, y z is the atomic composition ratio), the second ferromagnetic layer 148 is made of $Co_xFe_yB_z$, and the x, y, z in the first ferromagnetic layer 144 is different from the x, y, z in the second ferromagnetic layer 148. In some embodiments, the first ferromagnetic layer 144 and the second ferromagnetic layer 148 are independently formed by electro-plating process, electroless plating process, sputtering process, chemical vapor deposition (CVD) process, or another applicable process.

The insulator layer 146 is made of dielectric layer, such as Magnesium Oxide (MgO), Aluminum Oxides (AlOx or Al$_2$O$_3$), or Titanium Oxides (TiOx or TiO$_2$). In some embodiments, the insulator layer 146 is made of Magnesium Oxide (MgO). In some embodiments, the insulator layer 146 is formed by a deposition process, such as chemical vapor deposition (CVD) process, physical vapor deposition (PVD) process, atomic layer deposition (ALD) process, spin-on coating process, or another applicable process.

Next, a top electrode 152 is formed over the second ferromagnetic layer 148 of the MTJ cell 150. The top electrode 152 is made of conductive material, such as tantalum (Ta), titanium (Ti), platinum (Pt), copper (Cu), tungsten (W), aluminum (Al), titanium nitride (TiN), tantalum nitride (TaN), and tungsten silicide (WSi), tantalum nitride (TaN), or another applicable material. In some embodiments, the top electrode 152 is formed by electroplating process, electroless plating process, sputtering process, chemical vapor deposition (CVD) process, or another applicable process.

It should be noted that the step of forming the bottom electrode 142, the step of forming the MTJ cell 150 and the step of forming the top electrode 152 are performed in three different vacuumed chambers but the substrate 102 is kept in the vacuum situation while transferring the substrate 102 from different chambers. The three steps are performed in "in-situ". The term "in-situ" indicates that no vacuum-break occurs between the two steps. Since the substrate 102 is kept in a vacuum environment, it is not exposed to external substances such as oxygen, moisture and the like. The risk of pollution of the semiconductor memory structure 100 is reduced.

Figure 1C:
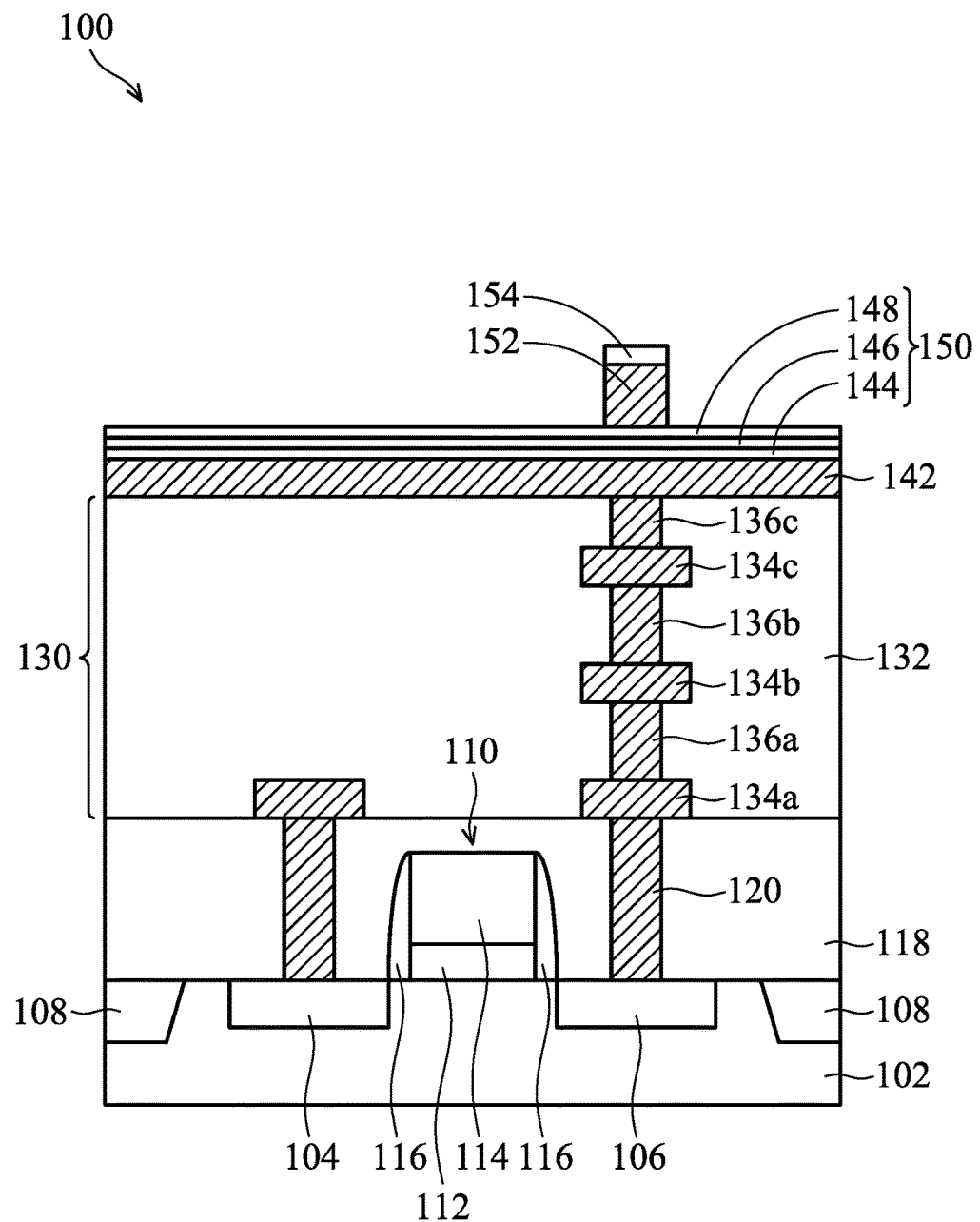

Afterwards, as shown in FIG. 1C, a hard mask layer 154 is formed on the top electrode 152, in accordance with some embodiments of the disclosure. The hard mask layer 154 is used as a mask for patterning the top electrode 152. The top electrode 152 is patterned by a patterning process. The patterning process includes a photolithography process and an etching process. Examples of photolithography processes include soft baking, mask aligning, exposure, post-exposure baking, developing the photoresist, rinsing and drying (e.g., hard baking). The etching process may be a dry etching or a wet etching process.

Figure 1D:
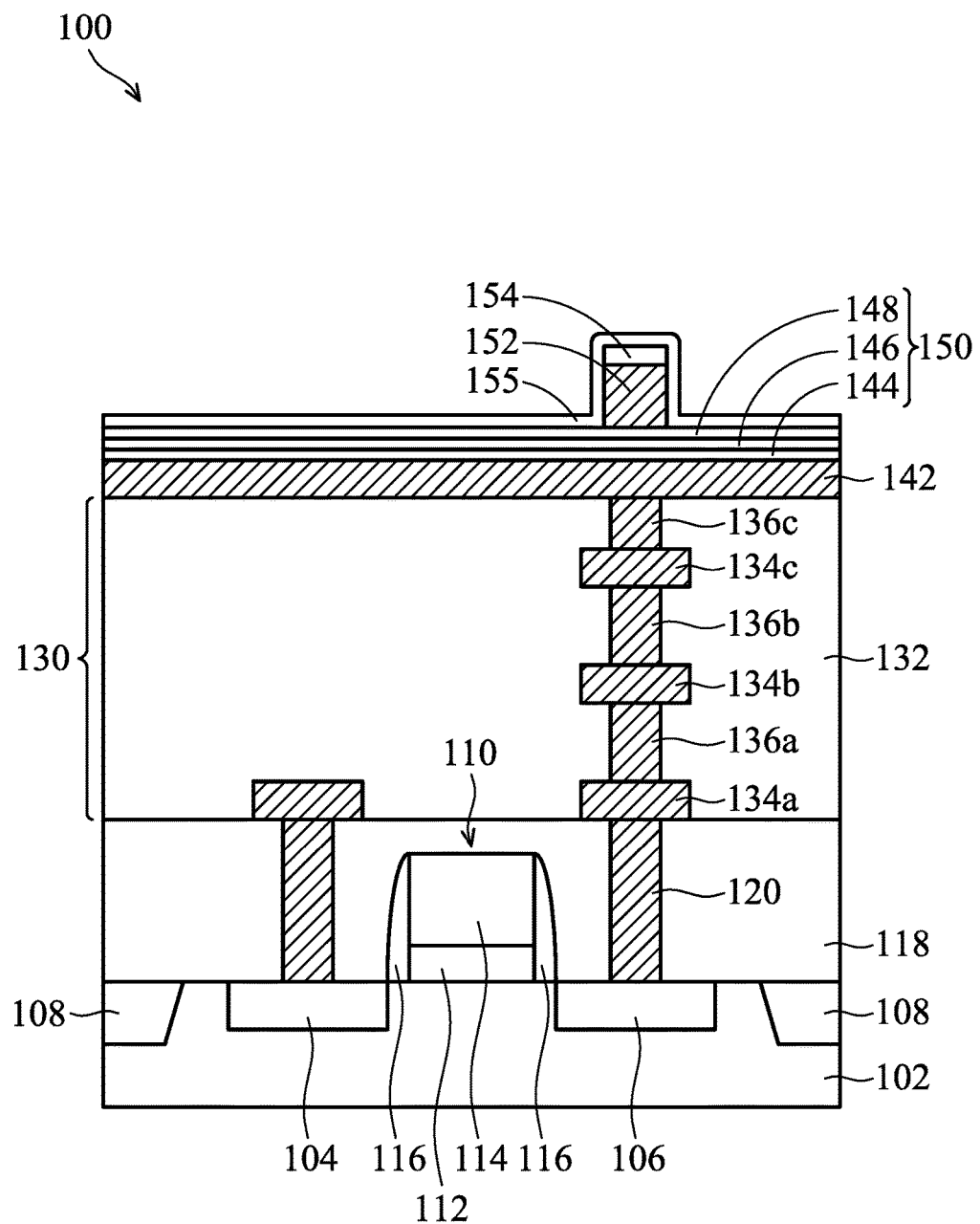

Next, as shown in FIG. 1D, after patterning the top electrode 152, the top surface of the second ferromagnetic layer 148 is exposed, and a first sidewall spacer material 155 is formed on the hard mask layer 154 and the exposed top surface of the second ferromagnetic layer 148, in accordance with some embodiments of the disclosure.

The first sidewall spacer material 155 may be a single layer or a multiple layers. In some embodiments, the first sidewall spacer material 155 is made of dielectric material, such as silicon oxide, silicon nitride, silicon oxynitride or another applicable material. In some embodiments, the first sidewall spacer material 155 is formed by a deposition process, such as chemical vapor deposition (CVD) process, physical vapor deposition (PVD) process, atomic layer deposition (ALD) process, spin-on coating process, or another applicable process.

Figure 1E:
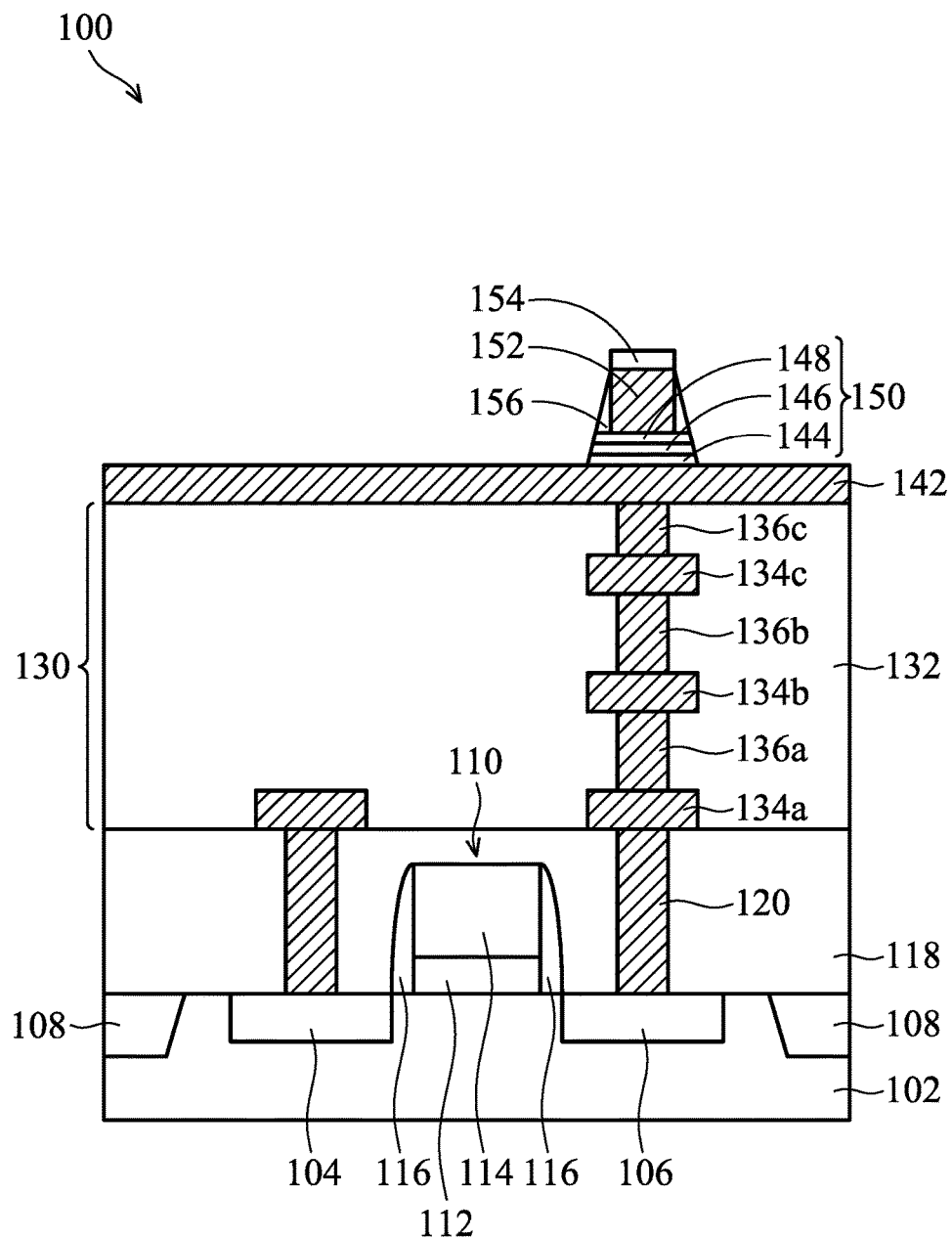

Afterwards, as shown in FIG. 1E, the first sidewall spacer material 155 and the MTJ cell 150 are simultaneously patterned by using the hard mask layer 154 as a mask, in accordance with some embodiments of the disclosure. As a result, a first sidewall spacer layer 156 is formed on a top surface of the MTJ cell 150 and an outer sidewall surface of the top electrode 152.

It should be noted that the MTJ cell 150 is difficult to remove relative to the removal of the top electrode 152 because the first ferromagnetic layer 144 and the second ferromagnetic layer 148 are made of magnetic oxide which are hard to etch. Therefore, the width of the MTJ cell 150 is wider than the width of the top electrode 152 to form a space (not shown) between the sidewall surface of the top electrode 152 and the top surface of the MTJ cell 150. More specifically, a width of the top surface of the second ferromagnetic layer 148 in the MTJ cell 150 is wider than a width of a bottom surface of the top electrode 152. In addition, the MTJ cell 150 has a pair of sloped sidewall surfaces. In other words, the MTJ cell 150 has a trapezoid-shaped structure. The width of the second ferromagnetic layer 148 is wider than the width of the insulator layer 146, and the width of the insulator layer 146 is wider than the width of the first ferromagnetic layer 144.

If no sidewall spacer layer is formed on the sidewall surfaces of the top electrode 152, a portion of the sidewall surface of the top electrode 152 is exposed while patterning the MTJ cell 150. A portion of materials of the MTJ cell 150 may be re-deposited on the exposed top surface of the second ferromagnetic layer 148 and on sidewall surfaces of the top electrode 152. However, the re-deposited materials or by-products are difficult to remove since the first ferromagnetic layer 144 and the second ferromagnetic layer 148 are made of magnetic oxide which has a high boiling point. In addition, the re-deposited first ferromagnetic layer 144 and/or the second ferromagnetic layer 148 may cause an unwanted electrical shorting problem. Therefore, the first sidewall spacer layer 156 is formed on the sidewall surfaces of the top electrode 152 to prevent the accumulation of the by-products during the etching process.

The first sidewall spacer layer 156 and the MTJ cell 150 are simultaneously patterned. In some embodiments, a portion of the first sidewall spacer layer 156 and a portion of the MTJ cell 150 are simultaneously removed by an etching process, such as a dry etching process. The etching gas of the etching process includes an alcohol, such as methanol (CH$_3$OH), ethanol (C$_2$H$_5$OH) or propanol (C$_3$H$_7$OH). In some other embodiments, the etching gas includes carbon monoxide (CO) gas and ammonia (NH$_3$) gas.

In addition, the first sidewall spacer layer 156 has a top surface and a bottom surface, and the first sidewall spacer layer 156 has a tapered width gradually tapered from the bottom surface to the top surface. The top surface of the first sidewall spacer layer 156 is level with the top surface of the top electrode 152. In some embodiments, the first sidewall spacer layer 156 has a triangular-shaped structure.

Figure 1F:
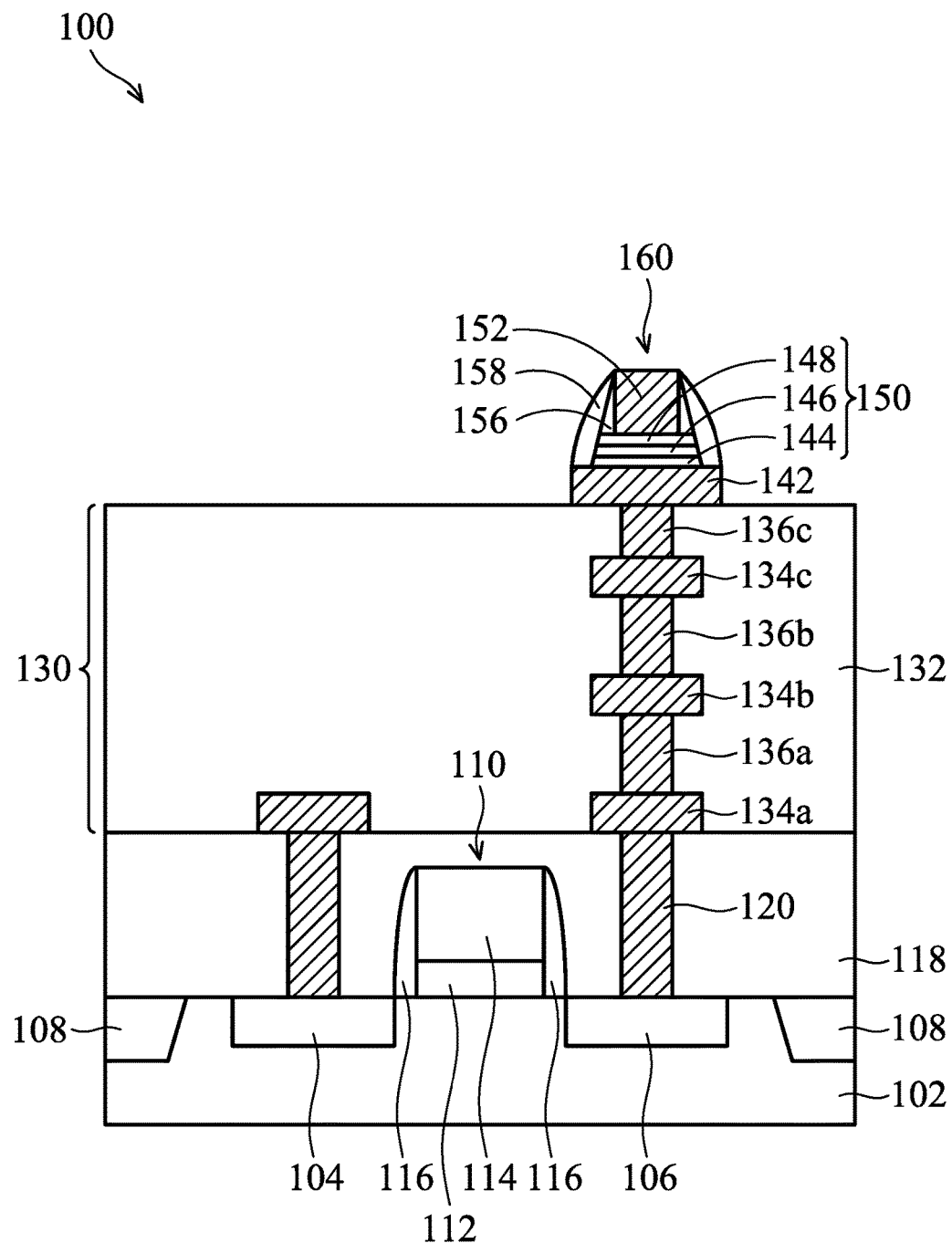

Afterwards, as shown in FIG. 1F, a second sidewall spacer layer 158 is formed on the first sidewall spacer layer 156, the sidewall surfaces of the MTJ cell 150 and a top surface of the bottom electrode 142, in accordance with some embodiments of the disclosure. More specifically, the second sidewall spacer layer 158 is in direct contact with the MTJ cell 150 and the top surface of the bottom electrode 152. The bottom surface of the second sidewall spacer layer 158 is lower than the bottom surface of the first sidewall spacer layer 156. The second sidewall spacer layer 158 is used to prevent the oxidation of the MTJ cell 150, and to minimize the contamination or damage of the bottom electrode 142.

The second sidewall spacer layer 158 is conformally formed on the first sidewall spacer layer 156, the top surface of the top electrode 152, and the bottom electrode 142, and then the second sidewall spacer layer 158 is patterned by a patterned process. The patterning process includes a photolithography process and an etching process. Examples of photolithography processes include soft baking, mask aligning, exposure, post-exposure baking, developing the photoresist, rinsing and drying (e.g., hard baking). The etching process may be a dry etching or a wet etching process. When a portion the second sidewall spacer layer 158 is removed, the hard mask layer 154 is removed.

The second sidewall spacer layer 158 may be a single layer or a multiple layers. In some embodiments, the second sidewall spacer layer 158 is made of dielectric layer, such as silicon oxide, silicon nitride, silicon oxynitride or another applicable material. In some embodiments, the second sidewall spacer layer 158 is formed by a deposition process, such as chemical vapor deposition (CVD) process, physical vapor deposition (PVD) process, atomic layer deposition (ALD) process, spin-on coating process, or another applicable process.

In some embodiments, the first sidewall spacer layer 156 and the second sidewall spacer layer 158 are made of different materials. In some embodiments, the first sidewall spacer layer 156 is made of silicon nitride, and the second sidewall spacer layer 158 is made of silicon oxynitride.

Afterwards, the bottom electrode 142 is patterned by using the second sidewall spacer layer 158 as a mask. Therefore, the second sidewall spacer layer 158 is formed on the top surface of the bottom electrode 142. The outer sidewall surface of the second sidewall spacer layer 158 is aligned with the outer sidewall surface of the bottom electrode 142.

As shown in FIG. 1F, the memory device 160 includes the bottom electrode 142, the MTJ (Magnetic Tunnel Junction) cell 150 and the top electrode 152. The first sidewall spacer layer 156 is formed on outer sidewall surface of the top electrode 152, and the second sidewall spacer layer 158 is formed on outer sidewall surface of the MTJ cell 150. The first sidewall spacer layer 156 provides a protection for the top electrode 152, and the second sidewall spacer layer 158 provides a protection for the MTJ cell 150.

The MTJ cell 150 has a structure of ferromagnetic layer/insulation layer/ferromagnetic layer. When electrons having passed through a first ferromagnetic layer pass through an insulation layer served as a tunneling barrier, a tunneling probability changes depending on a magnetization direction of a second ferromagnetic layer. The tunneling probability becomes a maximum value when the magnetization directions of the two ferromagnetic layers are parallel to each other and the tunneling probability becomes a minimum when the magnetization directions of the two ferromagnetic layers are anti-parallel to each other. The amount of the tunneling current flowing between two ferromagnetic layers depends on the tunneling probability. For example, it may be considered that data '1' (or '0') is written when the tunneling current is large and data '0' (or '1') is written when the tunneling current is small. One of the two ferromagnetic layers serves as a fixed magnetic layer whose magnetization direction is fixed, and the other serves as a free magnetic layer whose magnetization direction is changed in response to an external magnetic field or electric current.

The first ferromagnetic layer 144 is a pin layer in which a magnetization state is fixed, and the second ferromagnetic layer 148 is a free layer in which a magnetization state varies depending upon a stored data. The insulator layer 146 is a non-magnetic layer sandwiched between the first ferromagnetic layer 144 and the second ferromagnetic layer 148. The first ferromagnetic layer 144 may be a single layer or a multiple layers, and the second ferromagnetic layer 148 may be a single layer or a multiple layers.

Figure 1G:
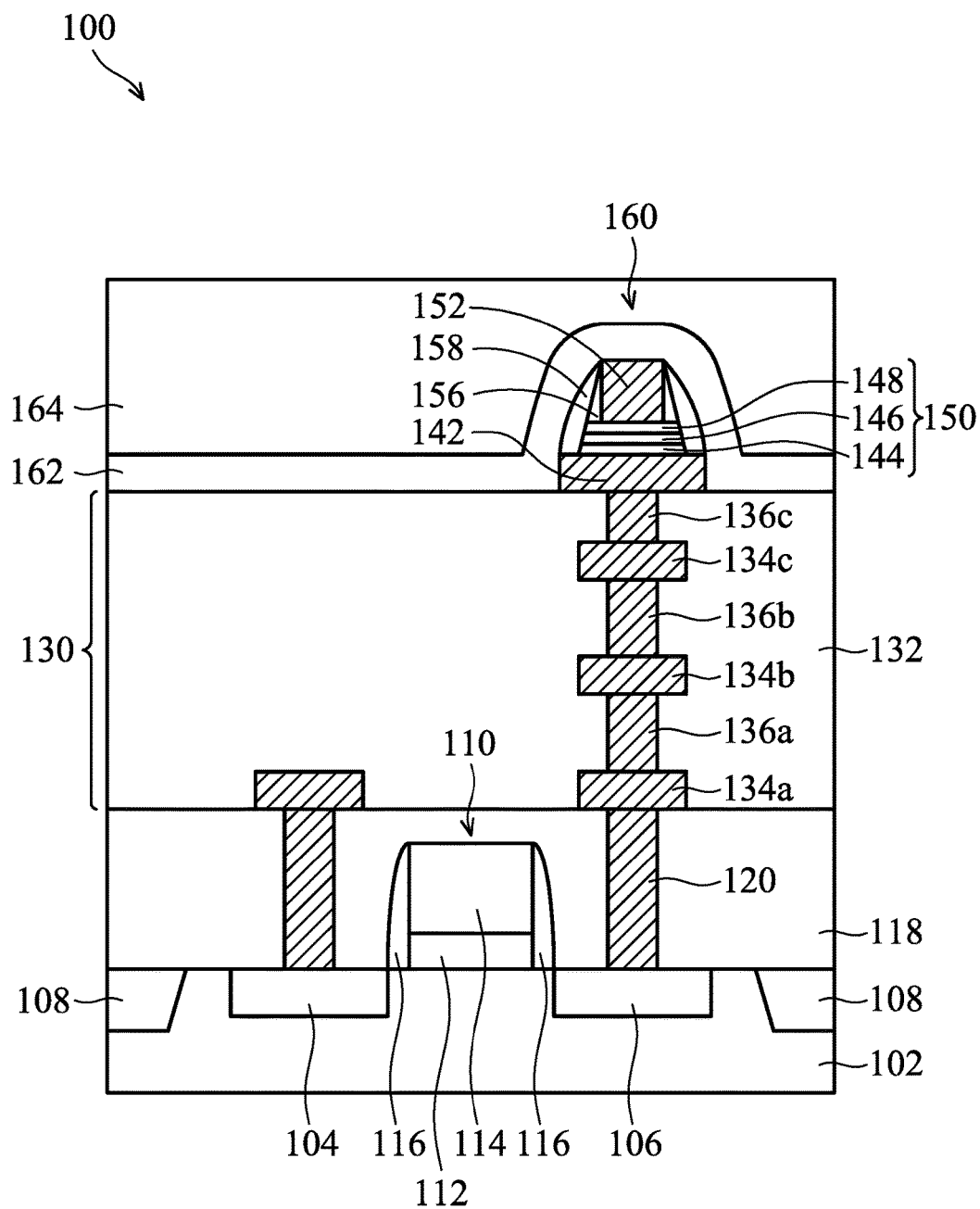

Afterwards, as shown in FIG. 1G, a passivation layer 162 is formed on the first dielectric layer 132 and the memory device 160, and afterwards a second dielectric layer 164 is formed over the passivation layer 162, in accordance with some embodiments of the disclosure. The passivation layer 162 surrounds the top electrode 152, the MTJ cell 150 and the bottom electrode 142.

The passivation layer 162 is configured to protect the underlying layers from being damaged or polluted by the outer environment, such as air or water vapor. The bottom surface of the second sidewall spacer layer 158 is higher than the bottom surface of the passivation layer 162 and lower than the bottom surface of the first sidewall spacer layer 156. The multiple protections are constructed by the first sidewall spacer layer 156, the second sidewall spacer layer 158 and the passivation layer 162. The first sidewall spacer layer 156 is between the top electrode 152 and the second sidewall spacer layer 158, and the second sidewall spacer layer 158 is between the first sidewall spacer layer 156 and the passivation layer 162.

The passivation layer 162 is made of dielectric layer. The passivation layer 162 may include non-organic materials, such as silicon oxide (SiOx), un-doped silicate glass, silicon oxynitride (SiON), solder resist (SR), silicon nitride (SixNy), HMDS (hexamethyldisilazane). In some other embodiments, the passivation layer 162 is made of a polymer material, such as polyimide (PI), epoxy, or fluorine (F)-containing polymer.

The second dielectric layer 164 may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the second dielectric layer 164 is formed by a deposition process, such as a chemical vapor deposition (CVD) process, a spin-on process, a sputtering process, or a combination thereof.

Figure 1H:
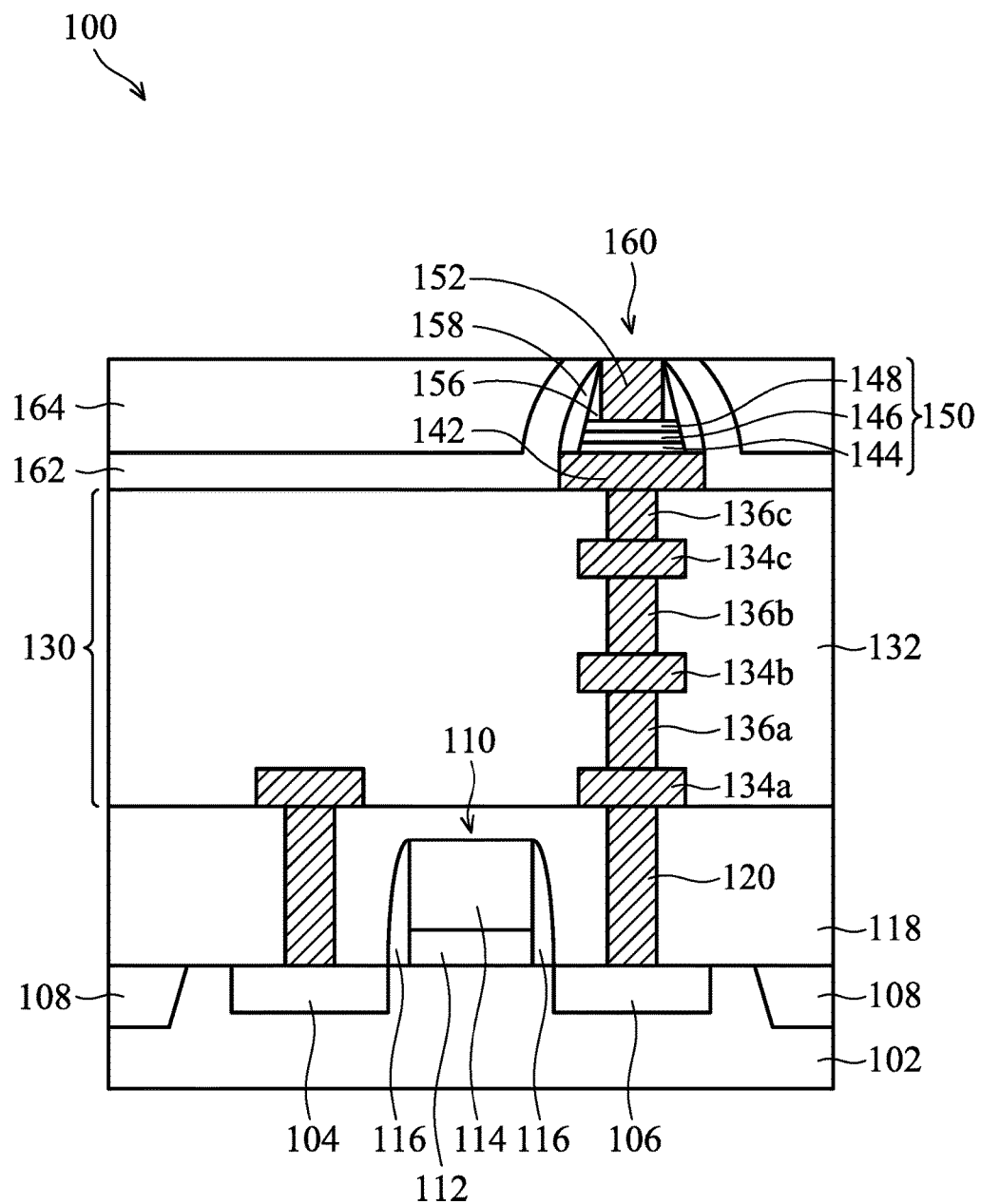

Next, as shown in FIG. 1H, a portion of the second dielectric layer 164 is removed to expose the top surface of the top electrode 152, in accordance with some embodiments of the disclosure. Therefore, the top surface of the top electrode 152 is level with the top surface of the first sidewall spacer layer 156 and the top surface of the second sidewall spacer layer 158.

In some embodiments, the portion of the second dielectric layer 164 is removed by a removal process, such as a polishing process (e.g. a chemical mechanical polishing (CMP) process), an etching process or a combination thereof.

Figure 1I:
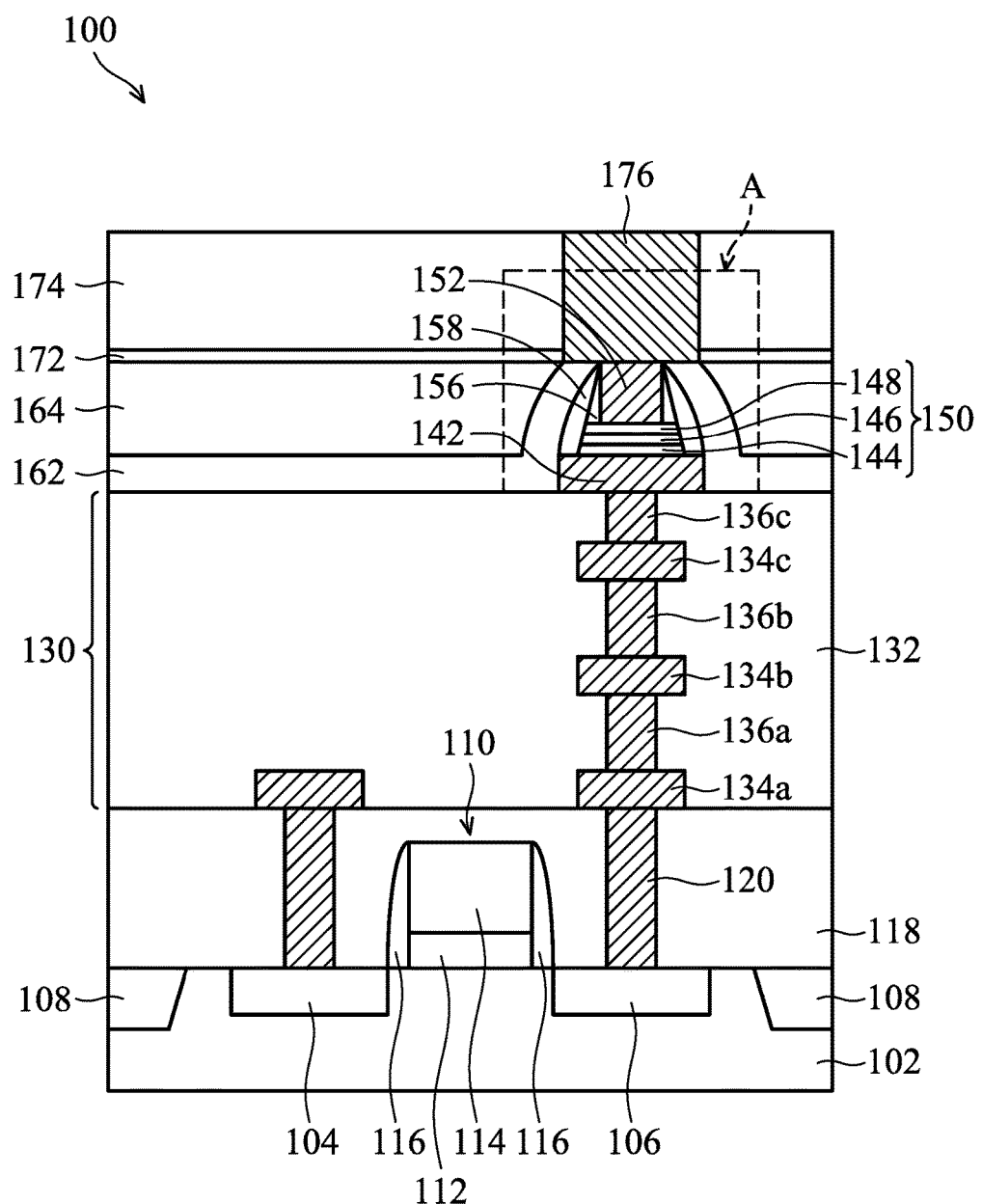

Afterwards, as shown in FIG. 1I, an etching stop layer 172 is conformally formed on the second dielectric layer 164, and then a third dielectric layer 174 is formed over the etching stop layer 172, in accordance with some embodiments of the disclosure.

The etching stop layer 172 may include silicon carbide (SiC), silicon nitride (SixNy), silicon carbonitride (SiCN), silicon oxycarbide (SiOC), silicon oxycarbon nitride (SiOCN), or another applicable material. In some embodiments, the etching stop layer 172 is formed by a chemical vapor deposition (CVD) process, a spin-on process, a sputtering process, or a combination thereof.

Afterwards, a portion of the third dielectric layer 174 and a portion of the etching stop layer 172 are removed to a trench (not shown). A contact structure 176 is formed in the trench (not shown). The contact structure 176 is electrically connected to the top electrode 152.

The first sidewall spacer layer 156 is formed on the sidewall surface of the top electrode 152 to prevent the unwanted by-products during etching process. The second sidewall spacer layer 158 is formed on sidewall surface of the MTJ cell 150 to protect the MTJ cell from being oxidized or damaged. The passivation layer 162 is formed on the first sidewall spacer layer 156 and the second sidewall spacer layer 158 to protect the underlying layers. The memory device 160 is protected by the three layers to improve the performance of the semiconductor memory structure 100.

Figure 2:
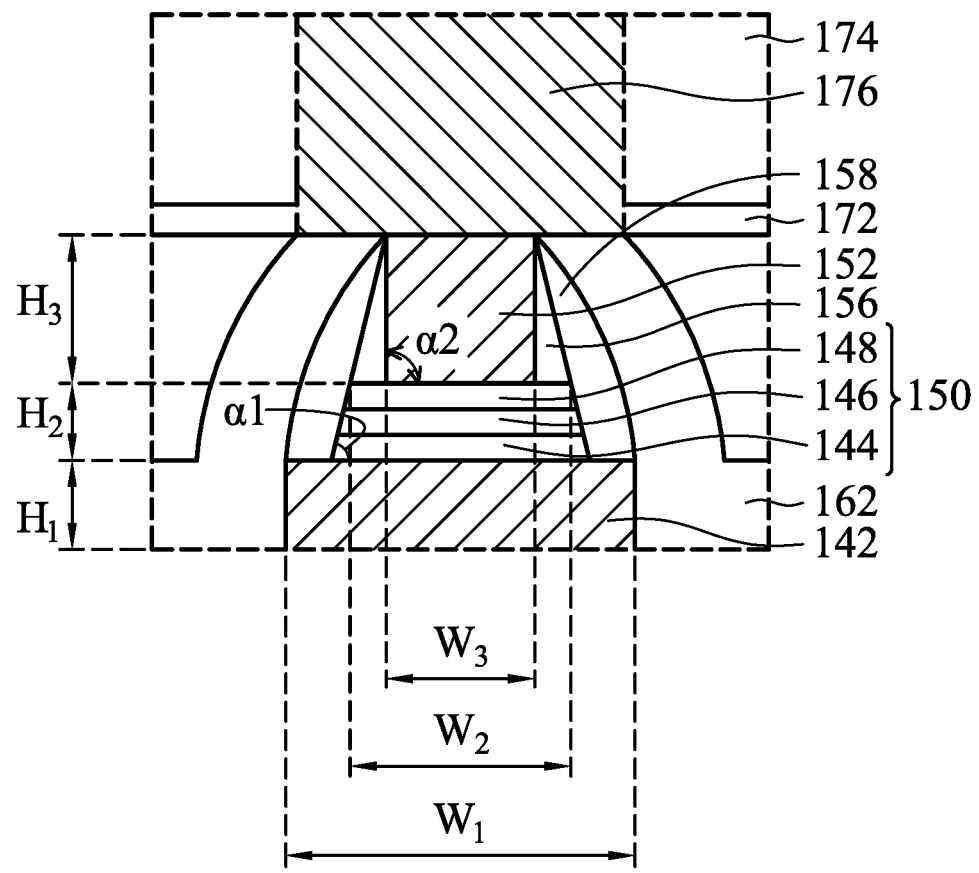
FIG. 2 shows an enlarged cross-sectional view of region A of FIG. 1I, in accordance with some embodiments of the disclosure.

FIG. 2 shows an enlarged cross-sectional view of region A of FIG. 1I, in accordance with some embodiments of the disclosure.

The bottom electrode 142 has a first height $H_1$ and a first width $W_1$. The MTJ cell 150 has a second height $H_2$ and the top surface of the MTJ cell 150 has a second width $W_2$. The top electrode 152 has a third height $H_3$ and the top surface of the top electrode 152 has a third width $W_3$. The first width $W_1$ is greater than the second width $W_2$, and the second width $W_2$ is greater than the third width $W_3$. In some embodiments, the first width $W_1$ is in a range from about 80 nm to about 130 nm. In some embodiments, the second width $W_2$ is in a range from about 50 nm to about 100 nm. In some embodiments, the third width $W_3$ is in a range from about 30 nm to about 80 nm.

In some embodiments, the third height $H_3$ is greater than the first height $H_1$, and the first height $H_1$ is greater than the second height $H_2$. In some embodiments, the first height $H_1$ is in a range from about 10 nm to about 50 nm. In some embodiments, the second height $H_2$ is in a range from about 10 nm to about 35 nm. In some embodiments, the third height $H_3$ is in a range from about 10 nm to about 60 nm. In some other embodiments, the third height $H_3$ or the first height $H_1$ higher than the second height $H_2$.

As shown in FIG. 2, a first angle $\alpha_1$ is between the outer sidewall surface and the bottom surface of the MTJ cell 150, and the first angle $\alpha_1$ is acute angle (smaller than 90 degrees). In other words, the first angle α1 is between the outer sidewall surface and the bottom surface of the first ferromagnetic layer 144. A second angle $\alpha_2$ is between the outer sidewall surface and the bottom surface of the top electrode 152. The second angle $\alpha_2$ is greater than the first angle $\alpha_1$. In some embodiments, the first angle $\alpha_1$ is in a range from about 60 degrees to about 85 degrees. In some embodiments, the second angle $\alpha_2$ is in a range from about 70 degrees to about 90 degrees.

In some embodiments, the thickness of the passivation layer 162 is greater than the thickness of the second sidewall spacer layer 158, and the thickness of the second sidewall spacer layer 158 is greater than the thickness of the first sidewall spacer layer 156.

FIGS. 3A-3D show cross-sectional representations of various stages of forming a semiconductor memory structure 100', in accordance with some embodiments of the disclosure. Some processes and materials used to form the semiconductor memory structure 100' are similar to, or the same as, those used to form the memory device 160 and are not repeated herein.

Figure 3A:
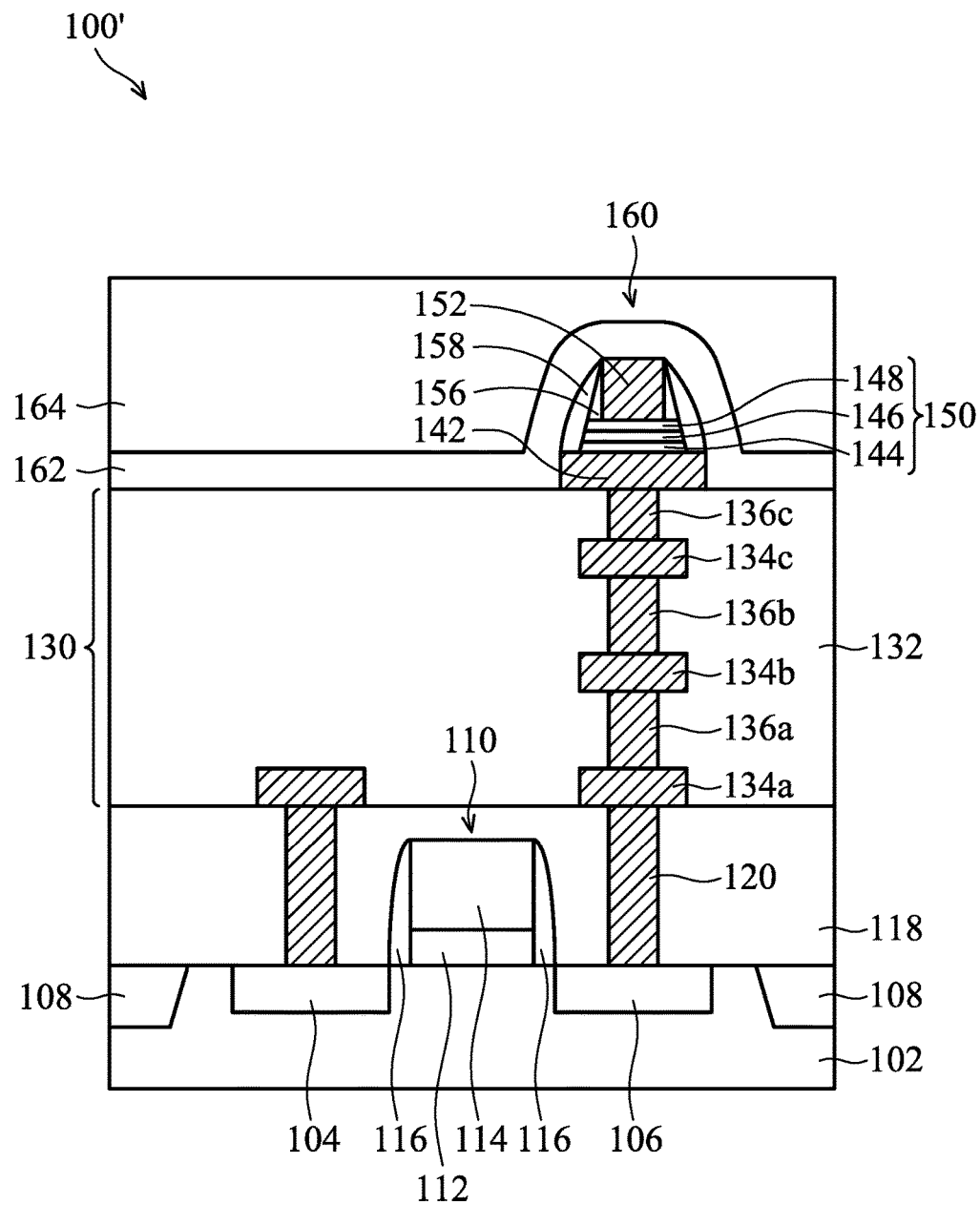
FIGS. 3A-3D show cross-sectional representations of various stages of forming a semiconductor memory structure, in accordance with some embodiments of the disclosure.

As shown in FIG. 3A, the transistor device 110 is formed over the substrate 102, and the interconnect structure 130 is formed over the transistor device 110. The memory device 160 is formed over the interconnect structure 130. The memory device 160 includes the bottom electrode 142, the MTJ (Magnetic Tunnel Junction) cell 150 and the top electrode 152. The first sidewall spacer layer 156 is formed on sidewall surfaces of the top electrode 152 to prevent some by-products formed on the sidewall surfaces of the top electrode 152. The second sidewall spacer layer 158 is formed on the first sidewall spacer layer 156 and protects the top electrode 152 and the MTJ cell 150. The passivation layer 162 is formed on the first dielectric layer 132 and the memory device 160, and afterwards the second dielectric layer 164 is formed over the passivation layer 162.

Figure 3B:
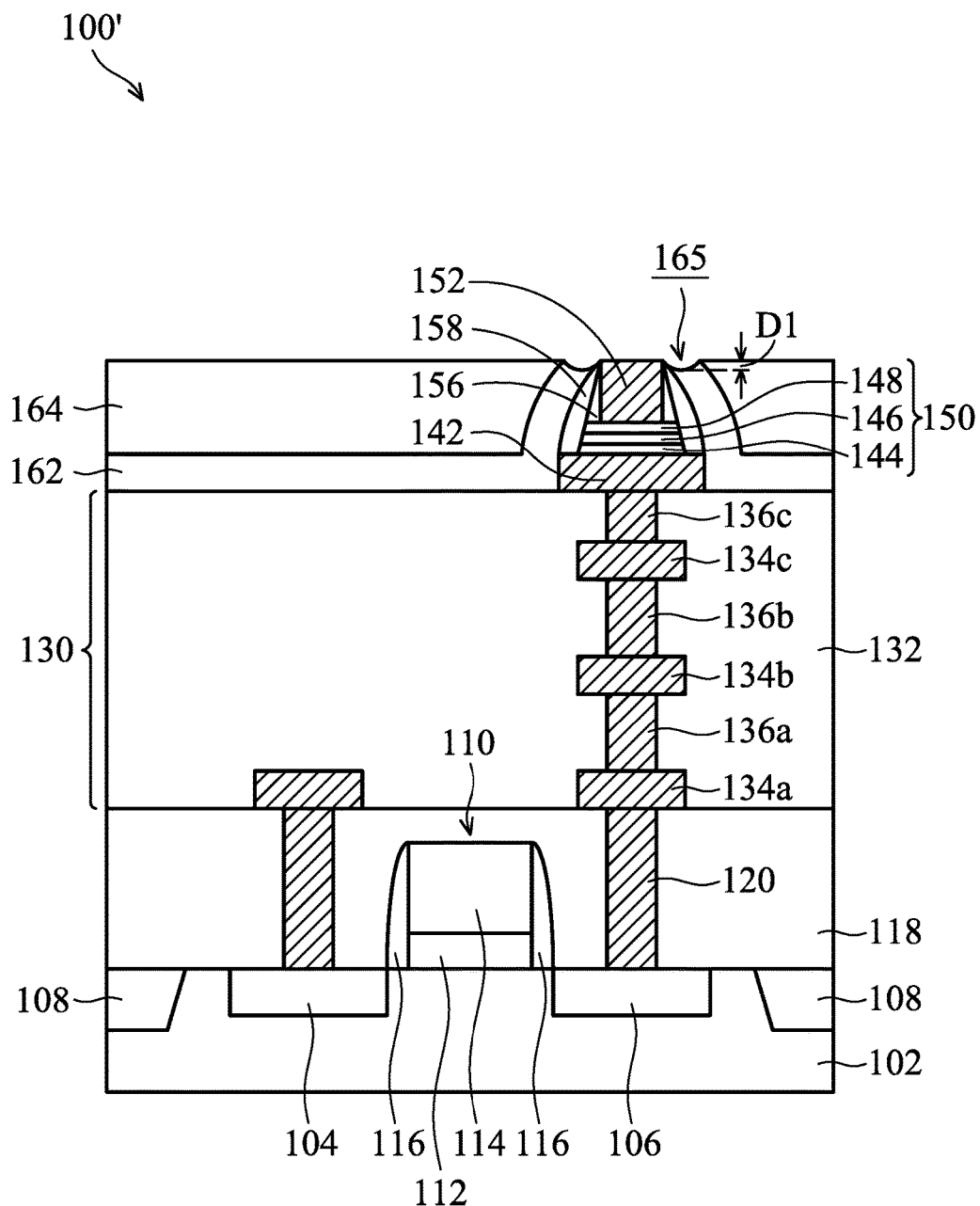

As shown in FIG. 3B, a portion of the second dielectric layer 164 is removed, in accordance with some embodiments of the disclosure. In some embodiments, the portion of the second dielectric layer 164 is removed by a multiple removal processes. In some embodiments, a polishing process, such as a chemical mechanical polishing (CMP) process is performed is firstly performed, and afterwards an etching process is performed to remove the portion of the second dielectric layer 164.

After performing the removal processes, a portion of the second dielectric layer 164, a portion of the passivation layer 162, a portion of the first sidewall spacer layer 156 and a portion of the second sidewall spacer layer 158 are recessed because the etching resistance of the passivation layer 162 may be not good enough to resist the etching process. As a result, a recess 165 is formed. The passivation layer 162 has a recessed portion that is lower than the top surface of the top electrode 152. The top surface and a portion of the sidewall surface of the top electrode 152 are exposed by the recess 165.

If the recess 165 is too deep, a contact structure made of conductive material which is filled in the recess 165 in the subsequent process may be in contact with the MTJ cell 150. The unwanted contact may increase the risk of the electrical shorting. In order to prevent the electrical shorting problem, a cap layer 170 is formed over the top electrode 152 in the subsequent process. The recess 165 has a first depth $D_1$ which is the distance between the lowest point and the top surface of the second dielectric layer 164. In some embodiments, the first depth $D_1$ of the recess 165 is in a range from about 5 nm to about 20 nm.

Figure 3C:
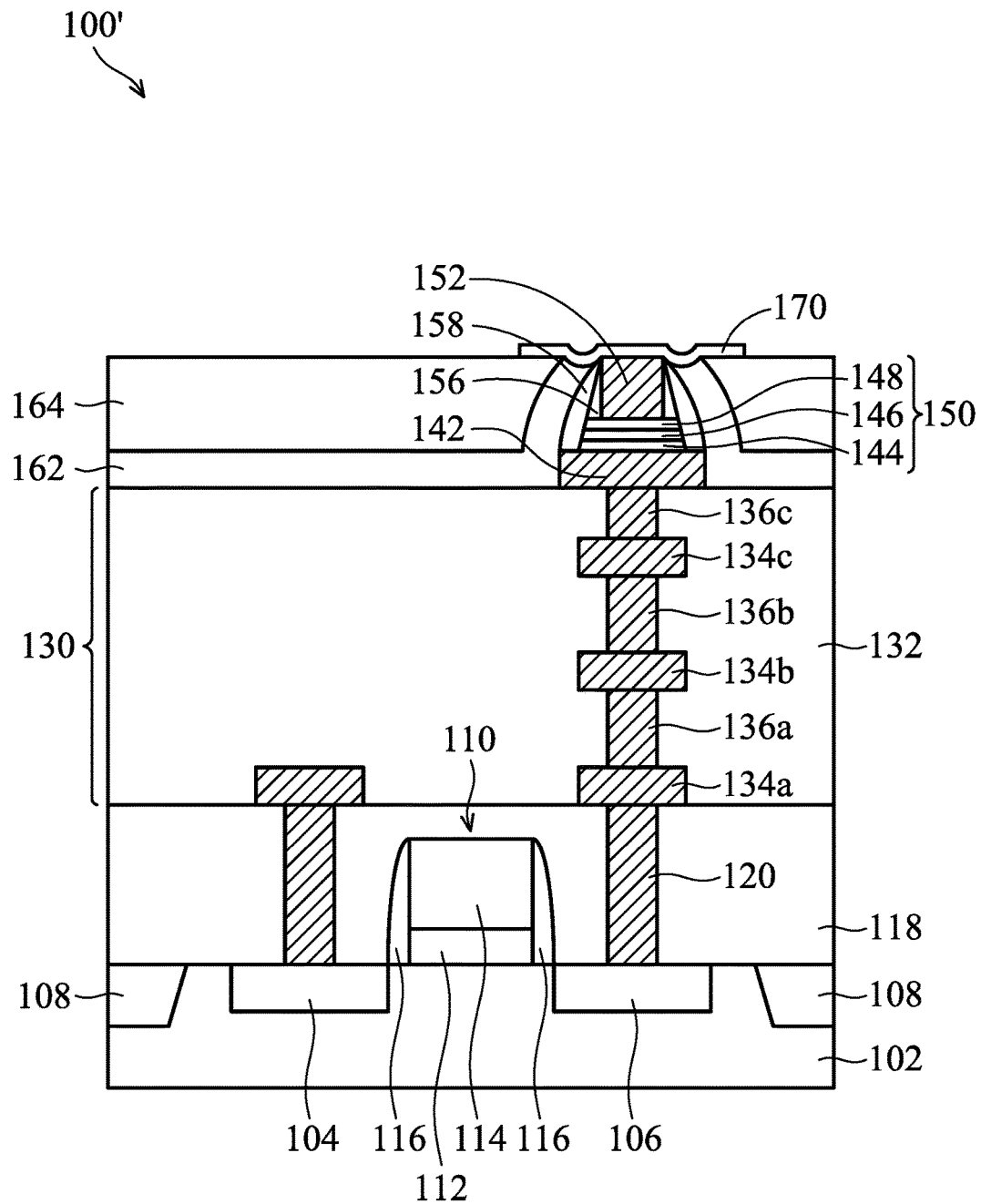

As shown in FIG. 3C, the cap layer 170 is formed on the recess 165, in accordance with some embodiments of the disclosure. The cap layer 170 is configured to protect the underlying layer from being etched or damaged. In addition, the cap layer 170 is used to prevent the top electrode 152 being oxidized. Since the cap layer 170 is a thin film, the cap layer 170 has a recess portion (alternatively, a protruding portion) which is formed in the recess 165.

Figure 3D:
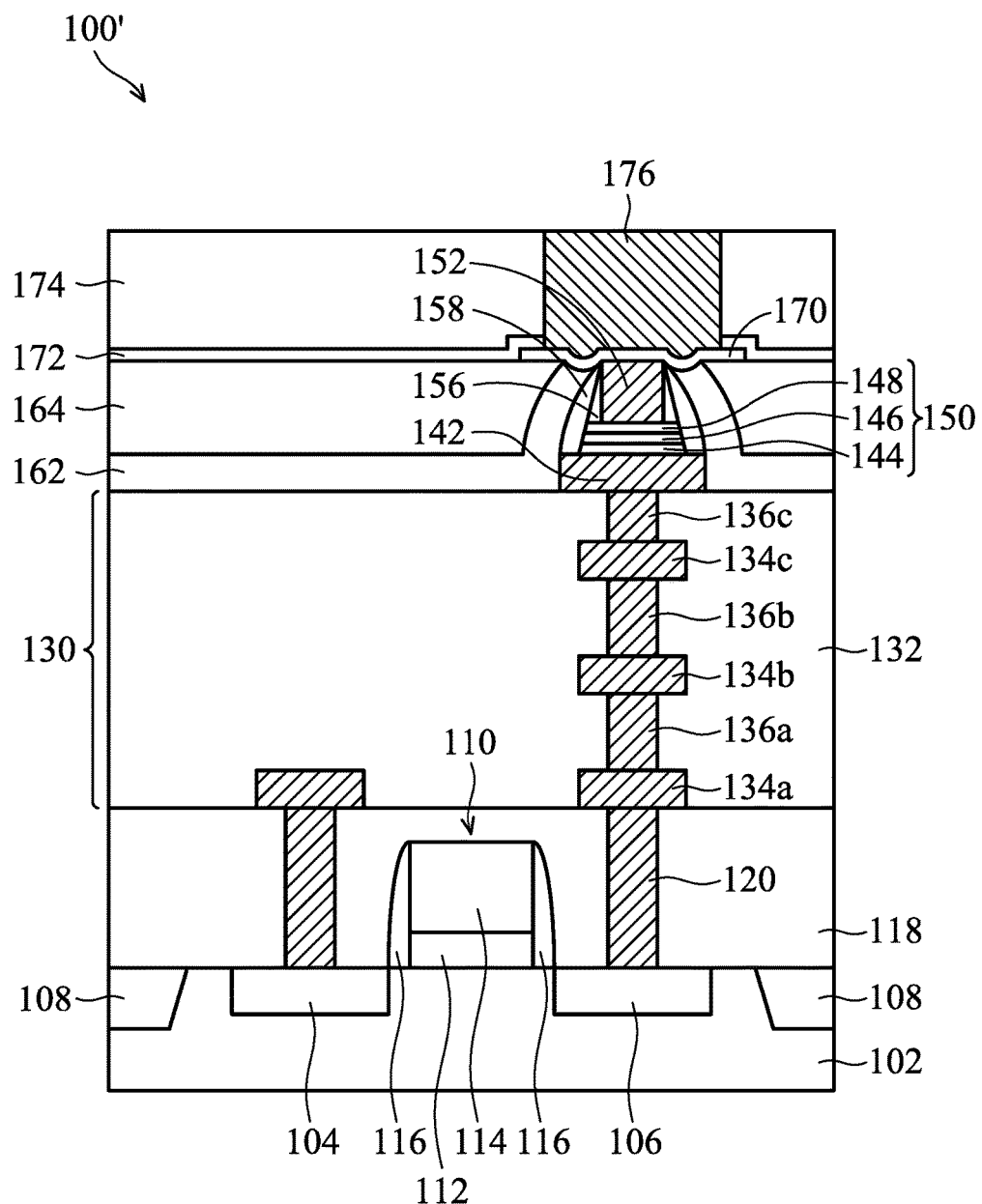

Afterwards, as shown in FIG. 3D, the etching stop layer 172 is conformally formed on the cap layer 170 and the second dielectric layer 164, and then the third dielectric layer 174 is formed over the etching stop layer 172, in accordance with some embodiments of the disclosure.

Afterwards, a portion of the third dielectric layer 174 and a portion of the etching stop layer 172 are removed to a trench (not shown). The contact structure 176 is formed in the trench (not shown). The contact structure 176 is electrically connected to the top electrode 152.

Figure 4:
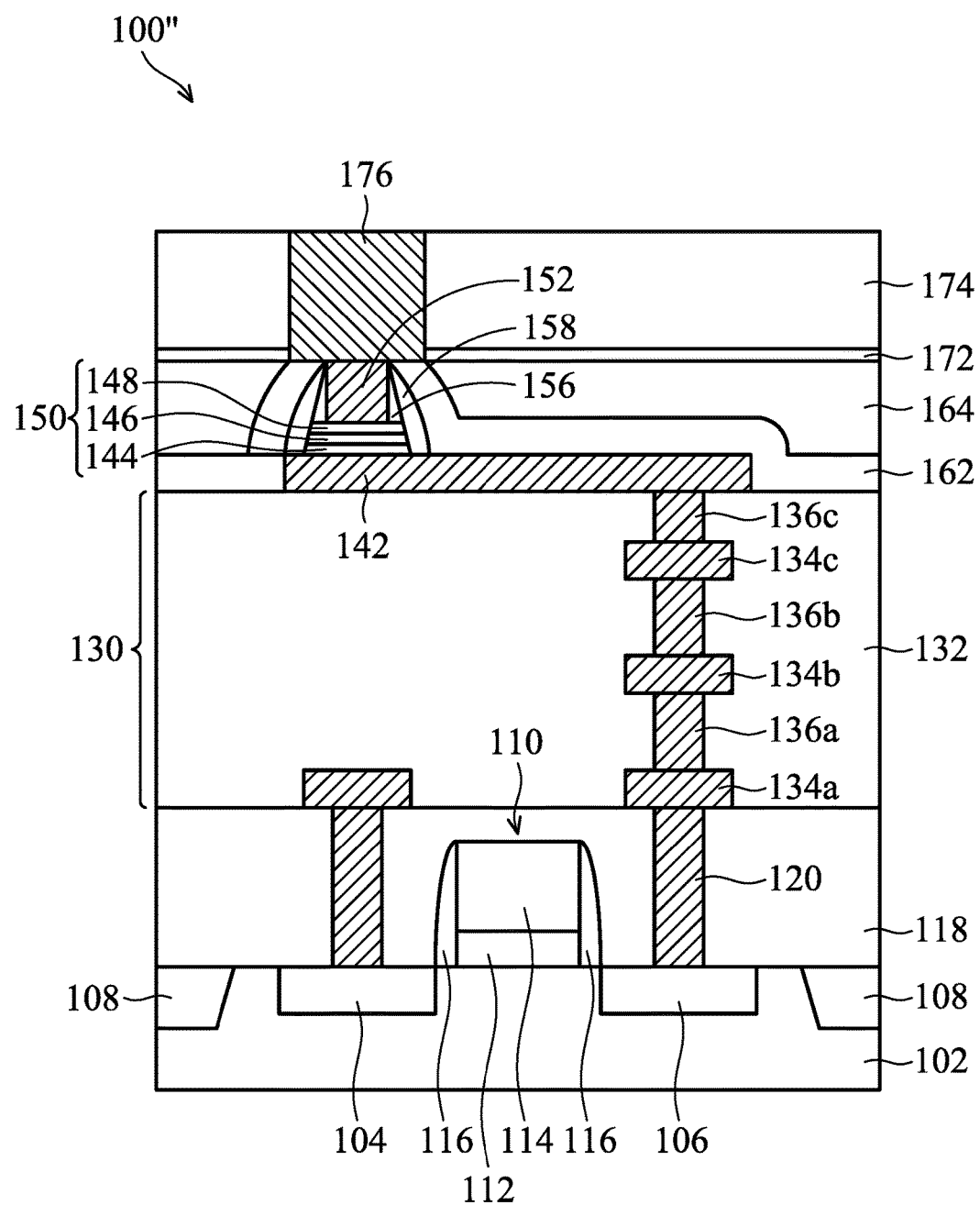
FIG. 4 shows a cross-sectional representation of a semiconductor memory structure, in accordance with some embodiments of the disclosure.

FIG. 4 shows a cross-sectional representation of a semiconductor memory structure 100", in accordance with some embodiments of the disclosure. Some processes and materials used to form the semiconductor memory structure 100 are similar to, or the same as, those used to form the semiconductor memory structure 100 and are not repeated herein.

The memory device 160 is directly above the source region 104. The bottom electrode 142 extends from a first position which is directly above the drain region 106 to a second position which is directly above the source region 104. The first sidewall spacer layer 156 is formed on the sidewall surfaces of the top electrode 152 to prevent the accumulation of the by-products during the etching process for patterning the MTJ cell 150. The second sidewall spacer layer 158 provides a protection for the MTJ cell 150 and is used as a mask for patterning the bottom electrode 142.

Embodiments for forming a semiconductor memory structure and method for formation of the same are provided. The semiconductor memory structure includes a bottom electrode over a substrate, a MTH cell over the bottom electrode, and a top electrode over the MTJ cell. A first sidewall spacer layer is formed on the outer sidewall surface of the top electrode and on the top surface of the MTJ cell to prevent the accumulation of the by-products during the etching process. Therefore, the unwanted electrical shorting problem is prevented. In addition, a second sidewall spacer layer is formed on the first sidewall spacer layer to prevent the oxidation of the MTJ cell, and a passivation layer is formed on the second sidewall spacer layer. The first sidewall spacer layer, the second sidewall spacer layer and the passivation layer provide multiple protections. Therefore, the performance of the semiconductor memory structure is improved.

In some embodiments, a semiconductor memory structure is provided. The semiconductor memory structure includes a bottom electrode formed over a substrate and a magnetic tunneling junction (MTJ) cell formed over the bottom electrode. The semiconductor memory structure also includes a top electrode formed over the MTJ cell; and a first sidewall spacer layer formed on the top surface of the MTJ cell and the outer sidewall surface of the top electrode.

In some embodiments, a semiconductor memory structure is provided. The semiconductor memory structure includes a bottom electrode formed over a substrate and a first ferromagnetic layer formed over the bottom electrode. The semiconductor memory structure also includes an insulator layer formed over the first ferromagnetic layer and a second ferromagnetic layer formed over the insulator layer. The semiconductor memory structure further includes a top electrode formed over the second ferromagnetic layer and a first sidewall spacer layer formed on a top surface of the first ferromagnetic layer. The first sidewall spacer layer has a tapered width which is gradually tapered from a bottom surface to a top surface. The semiconductor memory structure further includes a passivation layer surrounding the top electrode and the bottom electrode, and the first sidewall spacer layer is between the top electrode and the passivation layer.

In some embodiments, a method for forming a semiconductor memory structure is provided. The method includes forming a bottom electrode over a substrate and forming a magnetic tunneling junction (MTJ) cell over the bottom electrode. The method further includes forming a top electrode over the MTJ cell and forming a first sidewall spacer material on the top electrode. The method further includes simultaneously patterning the first sidewall spacer material and the MTJ cell to form a first sidewall spacer layer on a top surface of the MTJ cell and an outer sidewall surface of the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory structure, comprising:
   a bottom electrode formed over a substrate;
   a magnetic tunneling junction (MTJ) cell formed over the bottom electrode;
   a top electrode formed over and in direct contact with the MTJ cell; and
   a first dielectric sidewall spacer layer formed on a top surface of the MTJ cell and an outer sidewall surface of the top electrode, such that the first dielectric sidewall spacer layer is in direct contact with at least a portion of the top surface of the MTJ cell.

2. The semiconductor memory structure as claimed in claim 1, wherein the MTJ cell comprises:
   a first ferromagnetic layer formed on the bottom electrode;
   an insulator layer formed on the first ferromagnetic layer; and
   a second ferromagnetic layer formed on the insulator layer.

3. The semiconductor memory structure as claimed in claim 2, wherein the first ferromagnetic layer has a bottom surface with a bottom width, the second ferromagnetic layer has a top surface with a top width, and the bottom width is greater than the top width.

4. The semiconductor memory structure as claimed in claim 1, wherein the first dielectric sidewall spacer layer has a top surface and a bottom surface, and the first dielectric sidewall spacer layer has a tapered width gradually tapered from the bottom surface to the top surface.

5. The semiconductor memory structure as claimed in claim 4, wherein the top surface of the first dielectric sidewall spacer layer is level with a top surface of the top electrode.

6. The semiconductor memory structure as claimed in claim 1, further comprising:
   a second sidewall spacer layer formed on the first dielectric sidewall spacer layer, wherein the second sidewall spacer layer is in direct contact with the MTJ cell and a top surface of the bottom electrode.

7. The semiconductor memory structure as claimed in claim 6, further comprising:
   a passivation layer formed on the second sidewall spacer layer, wherein a bottom surface of the second sidewall spacer layer is higher than a bottom surface of the passivation layer and lower than a bottom surface of the first dielectric sidewall spacer layer.

8. The semiconductor memory structure as claimed in claim 1, further comprising:
   a contact structure formed over the top electrode, wherein the contact structure is electrically connected to the top electrode, and the contact structure is physically in direct contact with the first dielectric sidewall spacer layer.

9. The semiconductor memory structure as claimed in claim 1, further comprising:
   a cap layer formed on the top electrode, wherein a portion of a sidewall surface of the top electrode is covered by the cap layer.

10. The semiconductor memory structure as claimed in claim 1, wherein the first dielectric sidewall spacer layer has a triangular-shaped structure.

11. A semiconductor memory structure, comprising:
- a bottom electrode formed over a substrate;
- a first ferromagnetic layer formed over the bottom electrode;
- an insulator layer formed over the first ferromagnetic layer;
- a second ferromagnetic layer formed over the insulator layer;
- a top electrode formed over the second ferromagnetic layer;
- a first dielectric sidewall spacer layer formed on a top surface of the second ferromagnetic layer, wherein the first dielectric sidewall spacer layer has a tapered thickness which is gradually tapered from a bottom surface to a top surface; and
- a passivation layer surrounding the top electrode and the bottom electrode, wherein the first dielectric sidewall spacer layer is between the top electrode and the passivation layer.

12. The semiconductor memory structure as claimed in claim 11, further comprising:
- an interconnect structure formed below the bottom electrode, wherein the interconnect structure comprises a metal layer, and the metal layer is electrically connected to the bottom electrode.

13. The semiconductor memory structure as claimed in claim 11, further comprising:
- a transistor device formed over the substrate;
- a drain region formed in the substrate; and
- a source region formed in the substrate, wherein the drain region and the source region are at opposite sides of the transistor device, and the bottom electrode is directly over the drain region.

14. The semiconductor memory structure as claimed in claim 11, further comprising:
- a second sidewall spacer layer between the first dielectric sidewall spacer and the passivation layer, wherein an outer sidewall surface of the second sidewall spacer layer is aligned with an outer sidewall surface of the bottom electrode.

15. The semiconductor memory structure as claimed in claim 14, wherein a bottom surface of the second sidewall spacer layer is higher than a bottom surface of the passivation layer and lower than a bottom surface of the first dielectric sidewall spacer layer.

16. The semiconductor memory structure as claimed in claim 11, further comprising:
- a cap layer formed on the top electrode, wherein a portion of a sidewall surface of the top electrode is covered by the cap layer.

17. A semiconductor memory structure, comprising:
- a bottom electrode formed over a substrate;
- a magnetic tunneling junction (MTJ) cell formed over the bottom electrode;
- a top electrode formed over the MTJ cell; and
- a first dielectric sidewall spacer layer formed on a top surface of the MTJ cell and an outer sidewall surface of the top electrode, wherein the top surface of the MTJ cell has a width which is wider than that of a bottom surface of the top electrode, and a top surface of the bottom electrode has a width which is wider than that of a bottom surface of the MTJ cell, and wherein a bottommost surface of the first dielectric sidewall spacer is level with the top surface of the MTJ cell.

18. The semiconductor memory structure as claimed in claim 17, further comprising:
- a second sidewall spacer layer formed on the first dielectric sidewall spacer layer, wherein the second sidewall spacer layer is in direct contact with outer sidewall surfaces of the MTJ cell and a top surface of the bottom electrode.

19. The semiconductor memory structure as claimed in claim 17, further comprising:
- a cap layer formed on the top electrode, wherein a portion of a sidewall surface of the top electrode is covered by the cap layer, and wherein a portion of the first sidewall spacer layer is between the top electrode and the cap layer.

20. The semiconductor memory structure as claimed in claim 17, wherein the MTJ cell comprises:
- a first ferromagnetic layer formed on the bottom electrode;
- an insulator layer formed on the first ferromagnetic layer; and
- a second ferromagnetic layer formed on the insulator layer.

* * * * *